United States Patent
Yoshikawa et al.

(10) Patent No.: US 9,966,269 B2
(45) Date of Patent: May 8, 2018

(54) POLISHING LIQUID FOR CMP, POLISHING LIQUID SET FOR CMP, AND POLISHING METHOD

(71) Applicant: HITACHI CHEMICAL COMPANY, LTD., Tokyo (JP)

(72) Inventors: Shigeru Yoshikawa, Hitachi (JP); Munehiro Oota, Hitachi (JP); Takaaki Tanaka, Hitachi (JP); Takashi Shinoda, Albany, NY (US)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days. days.

(21) Appl. No.: 15/314,692

(22) PCT Filed: May 29, 2015

(86) PCT No.: PCT/JP2015/065602
§ 371 (c)(1),
(2) Date: Nov. 29, 2016

(87) PCT Pub. No.: WO2015/182756
PCT Pub. Date: Dec. 3, 2015

(65) Prior Publication Data
US 2017/0200617 A1 Jul. 13, 2017

(30) Foreign Application Priority Data

May 30, 2014 (JP) .................................. 2014-112855

(51) Int. Cl.
*C09K 13/06* (2006.01)
*H01L 21/306* (2006.01)
(Continued)

(52) U.S. Cl.
CPC ...... *H01L 21/30625* (2013.01); *B24B 37/044* (2013.01); *C09G 1/02* (2013.01); *C09K 3/1409* (2013.01); *H01L 21/3212* (2013.01)

(58) Field of Classification Search
CPC .... A61K 35/15; A61K 38/00; C09K 2317/31; C07K 14/57; C07K 14/705; C07K 16/18;
(Continued)

(56) References Cited

U.S. PATENT DOCUMENTS

2010/0022171 A1* 1/2010 Naguib .................. C03C 19/00
451/41
2012/0214307 A1* 8/2012 Yoshikawa ........... B24B 37/044
438/692
(Continued)

FOREIGN PATENT DOCUMENTS

JP   2008-270341 A   11/2008
JP   2009-280480 A   12/2009
(Continued)

OTHER PUBLICATIONS

International Search Report for PCT/JP2015/065602 dated Aug. 25, 2015; English translation submitted herewith (5 Pages).

*Primary Examiner* — Lan Vinh
(74) *Attorney, Agent, or Firm* — Fitch, Even, Tabin & Flannery LLP

(57) ABSTRACT

One embodiment of the present invention relates to a polishing liquid for CMP containing cerium oxide particles and water, wherein the half-value width of the main peak appearing within a range from 2θ=27.000 to 29.980° in a powder X-ray diffraction chart of the cerium oxide particles is from 0.26 to 0.36°, the average particle size of the cerium oxide particles is at least 130 nm but less than 175 nm, and the number of cerium oxide particles having a particle size of 1.15 μm or greater is 5000×10³/mL or less.

6 Claims, 2 Drawing Sheets

(51) Int. Cl.
  *B24B 37/04* (2012.01)
  *C09G 1/02* (2006.01)
  *C09K 3/14* (2006.01)
  *H01L 21/321* (2006.01)

(58) Field of Classification Search
  CPC .............. C07K 16/2866; C07K 16/30; C07K 2317/022; H01L 21/3212; H01L 21/03616; C09G 1/02
  USPC .... 252/79.1, 79.2, 79.3, 79.4; 438/691, 692, 438/693
  See application file for complete search history.

(56) References Cited

U.S. PATENT DOCUMENTS

2013/0109194 A1\* 5/2013 Shirota .................... C09G 1/02
  438/759
2013/0122705 A1\* 5/2013 Babu ........................ C09G 1/02
  438/693

FOREIGN PATENT DOCUMENTS

| JP | 2011-104680 A | 6/2011 |
| WO | 98/14987 A | 4/1998 |

\* cited by examiner

POLISHING LIQUID FOR CMP, POLISHING LIQUID SET FOR CMP, AND POLISHING METHOD

CROSS-REFERENCE TO RELATED APPLICATIONS

This application is a U.S. national phase application filed under 35 U.S.C. § 371 of International Application No. PCT/JP2015/065602, filed May 29, 2015, designating the United States, which claims priority from Japanese Patent Application No. 2014-112855 filed May 30, 2014, which are hereby incorporated herein by reference in their entirety.

TECHNICAL FIELD

Embodiments of the present invention relate to a polishing liquid for CMP, a polishing liquid set for CMP, and a polishing method.

BACKGROUND ART

A wide variety of CMP polishing liquids for use in CMP (Chemical Mechanical Polishing) are already known. If these CMP polishing liquids are classified on the basis of the abrasive grains (polishing particles) contained therein, then known CMP polishing liquids include cerium oxide CMP polishing liquids containing cerium oxide (ceria) particles as the abrasive grains, silicon oxide CMP polishing liquids containing silicon oxide (silica) particles as the abrasive grains, aluminum oxide CMP polishing liquids containing aluminum oxide (alumina) particles as the abrasive grains, and resin particle-based CMP polishing liquids containing organic resin particles as the abrasive grains.

Semiconductor element production processes require a plurality of planarization steps, and the polishing target (removal target) substance differs in each of these steps. Accordingly, a different CMP polishing liquid is used depending on the polishing target. One step for producing a semiconductor element is a step of polishing and planarizing an insulating material such as silicon oxide. Examples of this step include an STI (shallow trench isolation) formation step and an interlayer insulation film planarization step and the like. Silicon oxide CMP polishing liquids are known as examples of CMP polishing liquids for polishing insulating materials, but in recent years, cerium oxide CMP polishing liquids have been attracting considerable attention as they enable a faster polishing rate of inorganic insulating materials.

Patent Literature 1 discloses that when cerium oxide particles are used for polishing an insulating material, higher speed polishing is possible when the crystallite size (crystallite diameter) of the cerium oxide particles is large and crystal strain is minimal, namely when the crystallinity is favorable, but also discloses that the polishing target film tends to be more prone to scratching. Patent Literature 2 discloses that by using cerium oxide for which the cerium oxide crystallinity has been adjusted to satisfy a suitable range as the polishing material, polishing scratches can be reduced while maintaining a high polishing rate, and that by ensuring that the amount of cerium oxide particles having a particle size of 3 μm or more is restricted to not more than 500 ppm by mass of solids, polishing scratches can be reduced.

CITATION LIST

Patent Literature

PLT 1: WO 98/14987
PLT 2: JP 2008-270341 A

SUMMARY OF INVENTION

Technical Problem

As the design rules for semiconductor elements have become ever finer, demands have grown for further reductions in the polishing scratches caused by the types of cerium oxide CMP polishing liquids described above. For example, in STI processes, substrates and the like having portions of lines and spaces at a pitch of 40 nm or less are now being used. Generally, substrates having a pattern formed thereon tend to have trench portions (recessed portions, line portions) where a trench has been formed, and active portions (protruding portions, space portions) that have been masked by a stopper film, arranged in an alternating pattern. For example, the expression "lines and spaces at a pitch of 40 nm" means that the combined width of a line portion and a space portion is 80 nm. When this type of very fine pattern is formed, the requirements with regard to polishing scratches become significantly stricter.

Generally, reducing the particle size of the abrasive grains contained within the CMP polishing liquid is effective in reducing polishing scratches, but the polishing rate tends to decrease at the same time. Further, if the particle size is simply reduced, then during storage of the CMP polishing liquid, the abrasive grains may sometimes aggregate to form larger particles, which can then cause polishing scratches. From the viewpoint of improving the productivity of the semiconductor element production process, reducing the occurrence of polishing scratches while maintaining the polishing rate is desirable, but conventional CMP polishing liquids using cerium oxide particles cannot be said to have been entirely satisfactory in this regard.

The present invention has been developed in light of the above circumstances, and has an object of providing a polishing liquid for CMP that can achieve a combination of a high polishing rate and minimal polishing scratches for an insulating material, as well as a polishing liquid set for CMP and a substrate polishing method.

Solution to Problem

One embodiment of the present invention relates to a polishing liquid for CMP containing cerium oxide particles and water, wherein the half-value width of the main peak appearing within a range from 2θ=27.000 to 29.980° in a powder X-ray diffraction chart of the cerium oxide particles is from 0.26 to 0.36°, the average particle size of the cerium oxide particles is at least 130 nm but less than 175 nm, and the number of cerium oxide particles having a particle size of 1.15 μm or greater is not more than 5,000×10³ particles/mL.

In the present description, "L" indicates "liter".

The polishing liquid for CMP described above may also contain a water-soluble polymer.

In the present description, the term "water-soluble" is defined as meaning a solubility of at least 0.1 g in 100 g of water at 25° C.

Another embodiment of the present invention relates to a polishing liquid set for CMP that is used for obtaining the polishing liquid for CMP described above, the polishing liquid set for CMP including a first liquid containing cerium oxide particles and water, and a second liquid containing a water-soluble polymer and water.

Furthermore, another embodiment of the present invention relates to a method for polishing a substrate having an insulating material formed thereon, the method including removing an unnecessary portion of the insulating material using the polishing liquid for CMP described above, or a polishing liquid for CMP obtained using the polishing liquid set for CMP described above.

The present invention is related to the subject matter disclosed in Japanese Application 2014-112855 filed on May 30, 2014, the entire contents of which are incorporated herein by reference.

Advantageous Effects of Invention

The present invention is able to provide, within the field of CMP technology for polishing insulating materials, a polishing liquid for CMP that can achieve a combination of a high polishing rate and minimal polishing scratches, as well as providing a polishing liquid set for CMP and a substrate polishing method.

DESCRIPTION OF EMBODIMENTS

Figure 1:
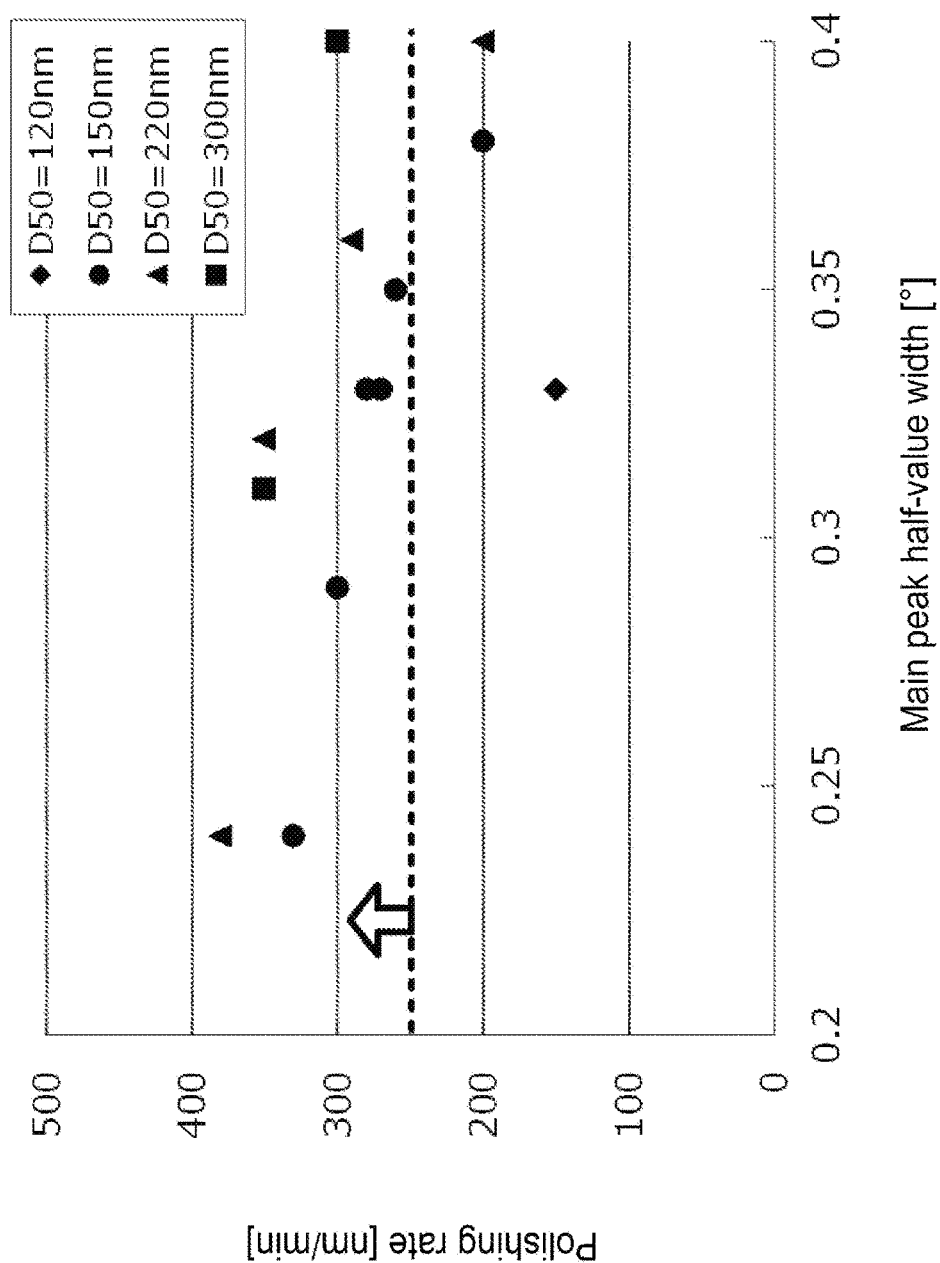
FIG. 1 is a graph illustrating the relationship between the main peak half-value width for cerium oxide particles and the polishing rate, for CMP polishing liquids obtained in a series of examples and comparative examples.

The inventors of the present invention discovered that by using the half-value width of the main peak (also referred to as the "main peak half-value width" in the present description) observed within a range from $2\theta=27.000$ to $29.980°$ in the powder X-ray diffraction chart as an indicator of crystallinity, and then ensuring that the crystallinity of the cerium oxide particles was within a prescribed range, ensuring that the average particle size of the cerium oxide particles was within a prescribed range, and reducing the number of cerium oxide particles exceeding a prescribed particle size, a polishing liquid for CMP could be provided that was capable of achieving a combination of a high polishing rate and minimal polishing scratches for insulating materials.

In the present description, the "half-value width" is defined as the interval between the two points of a peak at an intensity of ½ of the maximum peak value (the so-called full width at half maximum (FWHM)).

Embodiments of the present invention are described below in detail.

(Polishing Liquid for CMP)

The polishing liquid for CMP according to one embodiment of the present invention contains cerium oxide particles and water. Each of the components contained in the polishing liquid for CMP is described below in detail.

(Cerium Oxide Particles)

The cerium oxide particles can be obtained, for example, by oxidizing a cerium compound. Examples of the cerium compound include cerium salts such as the carbonate salt, nitrate salt, sulfate salt and oxalate salt, and among these, cerium carbonate (the carbonate salt of cerium) is preferred.

Examples of the method used for oxidizing the cerium compound include firing methods and oxidation methods using hydrogen peroxide or the like, and firing methods are preferred.

The cerium oxide particles used have a half-value width for the main peak (namely, the main peak half-value width) appearing within a range from $2\theta=27.000$ to $29.980°$ in a powder X-ray diffraction chart of the cerium oxide particles that is from 0.26 to 0.36°. By ensuring that the main peak half-value width for the cerium oxide particles is not more than 0.36°, a high polishing rate can be obtained for insulating materials. For the same reason, the main peak half-value width is preferably not more than 0.35°, and more preferably 0.34° or less. Further, by ensuring that the main peak half-value width for the cerium oxide particles is at least 0.26°, polishing scratches can be reduced. For the same reason, the main peak half-value width is preferably at least 0.27°, and more preferably 0.28° or greater.

These tendencies are marked when the insulating material is a silicon-based insulating material, more marked when the insulating material is a silicon oxide, and particularly marked when the insulating material is a silicon oxide formed by the TEOS-CVD method (tetraethoxysilane-chemical vapor deposition method) or the like. Further, although detailed reasons are not entirely clear, the above tendencies are more marked when the average particle size of the cerium oxide particles is within the prescribed range described below.

Here, the main peak half-value width for the cerium oxide particles means the value for the half-value width of the main peak in a chart obtained by measuring the particles with an X-ray diffraction apparatus (for example, "RINT2100" manufactured by Rigaku Corporation, measurement angle: $2\theta=27.000$ to $29.980°$, voltage: 40 kV, current: 20 mA). The main peak means the peak having the greatest peak intensity within the measurement angle range from $2\theta=27.000$ to $29.980°$. Measurement of the main peak half-value width is performed using a sample prepared by fixing the dried cerium oxide particles onto a grooved glass slide. If the cerium oxide particles have undergone sintering as a result of the drying, then they should be crushed before being fixed to the grooved glass slide. An example of a method for crushing the particles is a method in which the sintered product of the cerium oxide particles is placed in an agate mortar and subjected to grinding for a dozen or so revolutions. Furthermore, the measurement result is reported as a value obtained by subjecting the measured values to smoothing and BG (background) subtraction.

The main peak half-value width is an indicator of the crystallinity of the cerium oxide particles. When the half-value width is large, the crystallinity tends to be low, and the primary particle size (crystallite size) tends to be small. In contrast, when the half-value width is small, the crystallinity tends to be high, and the primary particle size (crystallite size) tends to be large.

Methods for controlling the main peak half-value width for the cerium oxide particles include a method in which the temperature is altered in a firing method, a method in which a plasma is used to vaporize and recrystallize the cerium oxide, and a method in which grinding is used to generate strain. More specifically, in the case of the method in which the temperature is altered in a firing method, lowering the temperature increases the main peak half-value width, whereas raising the temperature reduces the main peak half-value width. Further, in the case of the method using a plasma, using a coolant gas to cool the particles rapidly increases the main peak half-value width, whereas reducing the amount of the coolant gas and lengthening the plasma exposure time reduces the main peak half-value width. Furthermore, in the case of the method in which grinding is used to generate strain, increasing the grinding pressure increases the main peak half-value width, whereas reducing the grinding pressure reduces the main peak half-value width. Moreover, the main peak half-value width for the cerium oxide particles can also be controlled by conventional classification methods such as centrifugal separation and sedimentary classification.

The average particle size of the cerium oxide particles is at least 130 nm but less than 175 nm. Provided the average particle size of the cerium oxide particles is at least 130 nm, the polishing rate for insulating materials can be increased. For the same reason, the average particle size of the cerium oxide particles is preferably at least 135 nm, more preferably at least 140 nm, and even more preferably 145 nm or greater. Further, provided the average particle size is less than 175 nm, polishing scratches can be reduced. For the same reason, the average particle size of the cerium oxide particles is preferably less than 170 nm, more preferably less than 165 nm, and even more preferably less than 155 nm.

Methods for adjusting the average particle size of the cerium oxide particles include grinding, classification, and filtration methods and the like. These methods may be used on the cerium oxide particles, or on the raw material (such as a cerium compound).

In this description, the average particle size of the cerium oxide particles means the D50 value (median size in a volume distribution, cumulative median) measured using a laser diffraction particle size distribution analyzer using three lasers. Examples of this type of particle size distribution analyzer include the apparatus "Microtrac MT3000II" manufactured by Nikkiso Co., Ltd. (light sources: semiconductor lasers), and measurements can be conducted with the particle refractive index set to 2.20.

The particle size distribution and the D50 value for the cerium oxide particles vary considerably depending on the measuring apparatus used. For example, apparatus such as the "MasterSizer Micro Plus" manufactured by Malvern Instruments Ltd. and the "LA-920" manufactured by Horiba, Ltd. are also known as measuring apparatus, but the D50 value and D99 value obtained sometimes differ from those obtained using the aforementioned laser diffraction particle size distribution analyzer "Microtrac MT3000II" which uses three lasers. In the present invention, the average particle size is measured using a laser diffraction particle size distribution analyzer that uses three lasers.

Measurement of the average particle size D50 may be performed using a sample obtained by diluting the CMP polishing liquid with water until an appropriate cerium oxide particle content is obtained (for example, in the case of a Microtrac, a content that yields a DV (Diffraction Volume) value of 0.0010 to 0.0150). Further, in those cases where, for example, the CMP polishing liquid contains cerium oxide particles, additives and water, and as described below, is stored as a cerium oxide slurry containing the cerium oxide particles dispersed in water, and a separate additives liquid containing the additives dissolved in water, the average particle size D50 may be measured by diluting the cerium oxide slurry with water until an appropriate cerium oxide particle content is obtained. The DV value is a concentration indicator that utilizes the total amount of scattered light from the sample received by a detector, and increases as the cerium oxide particle content within the sample increases.

In the polishing liquid for CMP, the number of cerium oxide particles having a particle size of 1.15 μm or greater is not more than $5,000 \times 10^3$ particles/mL. Provided the number of cerium oxide particles having a particle size of 1.15 μm or greater is not more than $5,000 \times 10^3$ particles/mL, polishing scratches can be reduced. The number of cerium oxide particles having a particle size of 1.15 μm or greater is preferably not more than $4,000 \times 10^3$ particles/mL, and more preferably $3,500 \times 10^3$ particles/mL or less. The number of cerium oxide particles is a value obtained using a measurement sample prepared by diluting or concentrating the CMP polishing liquid as required to adjust the amount of cerium oxide particles within 50 mL of water to 4 μg.

In this description, the number of cerium oxide particles having a particle size of 1.15 μm or greater means the number (particles/mL) of cerium oxide particles having a particle size of 1.15 μm or greater measured using a large particle measurement apparatus (a particle counting particle size distribution analyzer such as an "AccuSizer 780 AD" manufactured by Particle Sizing Systems, Inc.). Measurement of the number of cerium oxide particles having a particle size of 1.15 μm or greater may be conducted, for example, using a sample obtained by diluting the CMP polishing liquid with water until an appropriate cerium oxide particle content is obtained (for example, a content of 4 μg of cerium oxide particles per 50 mL of water). Further, in those cases where, for example, the cerium oxide CMP polishing liquid contains cerium oxide particles, additives and water, and as described below, is stored as a cerium oxide slurry containing the cerium oxide particles dispersed in water, and a separate additives liquid containing the additives dissolved in water, the number of cerium oxide particles may be measured by diluting the cerium oxide slurry with water until an appropriate cerium oxide particle content is obtained. The large particle measurement apparatus performs measurements by using a laser light irradiated through a measurement cell to count the number of particles. Because the scattering intensity changes depending on the size of the particles, large particle size measurement across a wide range may be performed by using a combination of a light blocking method and a light scattering method.

Examples of methods that may be used for reducing the number of cerium oxide particles having a particle size of 1.15 μm or greater include grinding methods, classification methods, and filtration methods and the like. These methods may be used on the cerium oxide particles, or on the raw material (such as a cerium compound).

From the viewpoint of obtaining a favorable polishing rate, the amount of the cerium oxide particles, relative to the total mass of the CMP polishing liquid, is preferably at least 0.1% by mass, more preferably at least 0.2% by mass, and even more preferably 0.3% by mass or greater. Further, from the viewpoint of suppressing particle aggregation and suppressing scratching of the polishing target region, the amount of the cerium oxide particles, relative to the total mass of the CMP polishing liquid, is preferably not more than 20% by mass, more preferably not more than 5.0% by mass, and even more preferably 2.0% by mass or less.

(Water)

There are no particular limitations on the water, but deionized water, ion-exchanged water, or ultra-pure water or the like is preferred. The amount of the water may make up the balance of the polishing liquid after inclusion of the other components, and there are no particular limitations on the amount, provided the polishing liquid for CMP contains water. The polishing liquid for CMP may also include a solvent other than water if required. Examples of this solvent other than water include polar solvents such as ethanol and acetone.

(Additives)

The polishing liquid for CMP according to the present invention may also contain an additive. Examples of the additive include water-soluble polymers and organic acids.

<Water-Soluble Polymer>

A water-soluble polymer may be used in the polishing liquid for CMP. Examples of the water-soluble polymer include polysaccharides, vinyl-based polymers and acrylic acid-based polymers. Including a water-soluble polymer enables an improvement in the smoothness of the polishing target region (for example, the silicon oxide portion) following the completion of polishing. More specifically, in those cases where a polishing target region having unevenness is subjected to polishing, the phenomenon known as dishing, in which a portion can undergo excessive polishing and form a concave dish shape, can be suppressed. This suppression effect can be obtained particularly efficiently when a combination of a water-soluble polymer and cerium oxide particles is used. Either a single polymer or a combination of two or more polymers may be used as the water-soluble polymer. Among the water-soluble polymers mentioned above, an acrylic acid-based polymer is preferred.

Examples of the polysaccharides include alginic acid, pectic acid, carboxymethyl cellulose, agar, curdlan and pullulan. Examples of the vinyl-based polymers include polyvinyl alcohol, polyvinylpyrrolidone and polyacrolein.

The aforementioned acrylic acid-based polymer is defined as a polymer having a structure obtained by polymerizing or copolymerizing a raw material containing a C=C—COOH structure as a polymerization component. Specific examples of the polymerization component used for obtaining the acrylic acid-based polymer include carboxylic acids such as acrylic acid, methacrylic acid, crotonic acid, vinylacetic acid, tiglic acid, 2-trifluoromethylacrylic acid, itaconic acid, fumaric acid, maleic acid, citraconic acid, mesaconic acid and gluconic acid, acrylate esters such as methyl acrylate, butyl acrylate, methyl methacrylate and butyl methacrylate, and carboxylic acid salts. Examples of the salts include ammonium salts, alkali metal salts and alkylamine salts, and ammonium salts are preferred.

Although there are no particular limitations on the weight-average molecular weight of the water-soluble polymer, from the viewpoint of making it easier to obtain a smoothness improvement effect, the weight-average molecular weight is preferably at least 1,000, more preferably at least 2,000, and even more preferably 3,000 or greater. Further, from the viewpoints of ensuring a satisfactory polishing rate for the polishing target region, and suppressing aggregation of the cerium oxide particles, the weight-average molecular weight of the water-soluble polymer is preferably not more than 100,000, more preferably not more than 50,000, even more preferably not more than 20,000, particularly preferably not more than 15,000, and most preferably 10,000 or less.

The weight-average molecular weight of the water-soluble polymer can be measured by gel permeation chromatography (GPC).

When an acrylic acid-based polymer is used as the water-soluble polymer, the weight-average molecular weight can be measured using the method described below. In the present description, "min" indicates "minutes".

Apparatus used (detector): model "L-3300" differential refractometer for liquid chromatograph, manufactured by Hitachi, Ltd.

Pump: "L-7100" for liquid chromatograph, manufactured by Hitachi, Ltd.

Degassing device: none

Data processing: GPC Integrator "D-2520", manufactured by Hitachi, Ltd.

Column: "Shodex Asahipak GF-710HQ", manufactured by Showa Denko K.K., internal diameter 7.6 mm×300 mm Eluent: 50 mM $Na_2HPO_4$ aqueous solution/acetonitrile=90/10 (v/v) Measurement temperature: 25° C.

Flow rate: 0.6 mL/min

Measurement time: 30 min

Sample: a sample prepared by adjusting the concentration with a solution having the same composition as the eluent to achieve a resin fraction concentration of 2% by mass, and then filtering through a 0.45 μm polytetrafluoroethylene filter Injection volume: 0.4 μL Standards: narrow molecular weight sodium polyacrylates manufactured by Polymer Laboratories Ltd.

When a polymer other than an acrylic acid-based polymer is used as the water-soluble polymer, the weight-average molecular weight can be measured using the method described below.

Apparatus used (detector): RI monitor "L-3000", manufactured by Hitachi, Ltd.

Pump: "L-6000", manufactured by Hitachi, Ltd.

Degassing device: "Shodex DEGAS" manufactured by Showa Denko K.K., (Shodex is a registered trademark)

Data processing: GPC Integrator "D-2200", manufactured by Hitachi, Ltd.

Columns: "GL-R440", "GL-R430" and "GL-R420" all manufactured by Hitachi Chemical Co., Ltd., connected in that order.

Eluent: tetrahydrofuran (THF)

Measurement temperature: 23° C.

Flow rate: 1.75 mL/min

Measurement time: 45 min

Injection volume: 10 μL

Standards: standard polystyrenes (molecular weights: 190,000, 17,900, 9,100, 2,980, 578, 474, 370, 266), manufactured by Tosoh Corporation.

If a water-soluble polymer is included, then from the viewpoint of improving the smoothness of the polishing target region (for example, the insulating material portion) following the completion of polishing, the amount of the water-soluble polymer relative to the total mass of the CMP polishing liquid is preferably at least 0.01% by mass, more preferably at least 0.02% by mass, even more preferably at least 0.03% by mass, particularly preferably at least 0.04% by mass, and most preferably 0.05% by mass or greater. Further, from the viewpoint of ensuring a satisfactory improvement in the polishing rate of the polishing target region, the amount of the water-soluble polymer relative to the total mass of the CMP polishing liquid is preferably not more than 0.5% by mass, more preferably not more than 0.3% by mass, even more preferably not more than 0.2% by mass, and particularly preferably 0.1% by mass or less. The amount of the water-soluble polymer is measured by quantifying the amount of the water-soluble polymer added to the CMP polishing liquid or the additives liquid.

<Organic Acid>

Besides the water-soluble polymer, the polishing liquid for CMP may also include an organic acid. The organic acid may exist in salt form. In this description, organic acids and organic acid salts may hereafter be jointly referred to as simply "organic acids". Organic acids can improve the polishing rate and improve the smoothness of the polishing target region (for example, the silicon oxide portion) following the completion of polishing. More specifically, when a polishing target surface having unevenness is polished, not only can the polishing time be shortened, but the so-called dishing phenomenon in which a portion can undergo excessive polishing and form a concave dish shape can be suppressed. These effects can be obtained particularly efficiently when a combination of an organic acid, a water-soluble polymer and cerium oxide particles is used. Either a single organic acid or a combination of two or more organic acids may be used.

The organic acid is preferably an organic acid having at least one group selected from the group consisting of a —COOM group, -Ph-OM group, —$SO_3M$ group and —$PO_3M_2$ group (wherein M represents $H^+$ or a cation, and Ph represents a phenyl group which may have a substituent), and having a pKa of less than 9. Examples of the cation include $NH_4^+$, $Na^+$ and $K^+$. For this type of organic acid, any of the compounds disclosed as organic acid A in WO 2012/086781 can be used without any particular limitations, and the organic acids listed therein are included herein by reference.

From the viewpoint of ensuring that at least a portion of the organic acid forms organic acid ions and emits hydrogen ions in the CMP polishing liquid, enabling the pH to be held within the desired range, the acid dissociation constant pKa at room temperature (25° C.) (in the case of two or more pKa values, the lowest first-stage $pKa_1$) is preferably less than 9. The pKa value is more preferably less than 8, even more preferably less than 7, particularly preferably less than 6, and most preferably less than 5. There are no particular limitations on the lower limit, but the pKa value is typically −10 or greater.

If an organic acid is included, then from the viewpoint of improving the smoothness of the polishing target region (for example, the insulating material portion) following the completion of polishing, the amount of the organic acid relative to the total mass of the CMP polishing liquid is preferably at least 0.001% by mass, more preferably at least 0.002% by mass, even more preferably at least 0.003% by mass, particularly preferably at least 0.004% by mass, and most preferably 0.005% by mass or greater. Further, from the viewpoint of ensuring a satisfactory improvement in the polishing rate of the polishing target region, the amount of the organic acid relative to the total mass of the CMP polishing liquid is preferably not more than 1% by mass, more preferably not more than 0.1% by mass, even more preferably not more than 0.05% by mass, particularly preferably not more than 0.03% by mass, and most preferably 0.01% by mass or less. When the organic acid is a salt, the amount of the organic acid is calculated as the mass when the cation is substituted with H.

(Dispersant)

A dispersant for dispersing the cerium oxide particles may be included in the polishing liquid for CMP. The dispersant adheres to the surfaces of the cerium oxide particles and exhibits a dispersive power. Examples of the dispersant include water-soluble anionic dispersants, water-soluble nonionic dispersants, water-soluble cationic dispersants, and water-soluble amphoteric dispersants. Either a single dispersant or a combination of two or more dispersants may be used. Among the above dispersants, water-soluble anionic dispersants are preferred, and acrylic acid-based polymers are particularly desirable. These acrylic acid-based polymers are as described above.

If a dispersant is included, then from the viewpoints of improving the dispersibility of the cerium oxide particles, suppressing precipitation, and further reducing polishing scratches on the polishing target region, the amount of the dispersant relative to the mass of the cerium oxide particles is preferably at least 0.2% by mass, more preferably at least 0.4% by mass, and even more preferably 0.8% by mass or greater. Further, for the same reasons, the amount of the dispersant relative to the mass of the cerium oxide particles is preferably not more than 200% by mass, more preferably not more than 100% by mass, and even more preferably 60% by mass or less.

There are no particular limitations on the weight-average molecular weight of the dispersant, but when an insulating material is to be polished, from the viewpoint of making it easier to obtain a favorable polishing rate, the weight-average molecular weight is preferably at least 100, more preferably at least 1,000, and even more preferably 1,500 or greater. Further, from the viewpoint of suppressing any deterioration in the storage stability of the CMP polishing liquid, the weight-average molecular weight of the dispersant is preferably not more than 150,000, more preferably not more than 25,000, and even more preferably 20,000 or less. The method used for measuring the weight-average molecular weight is as described above.

(Method for Preparing and Storing Polishing Liquid for CMP)

The polishing liquid for CMP can be obtained, for example, by mixing the cerium oxide particles and the water to disperse the cerium oxide particles, performing grinding and classification (by a sieving method, centrifugal separation method or sedimentation method or the like) as required, subsequently performing filtration or the like, and then adding optional components such as the water-soluble polymer and the organic acid and the like. The main peak half-value width for the cerium oxide particles can be changed by grinding, classification, and filtration and the like, provided that the final value for the CMP polishing liquid is within the range from 0.26 to 0.36°.

A dispersant may be used when dispersing the cerium oxide particles. In those cases where the CMP polishing liquid includes a dispersant and a water-soluble polymer, the polishing liquid may be stored as a single-liquid CMP polishing liquid containing the cerium oxide particles, the dispersant, the water-soluble polymer and water. The single-liquid CMP polishing liquid is preferably obtained by combining the cerium oxide particles, the dispersant and water, dispersing the cerium oxide particles, and then adding the water-soluble polymer. Alternatively, the polishing liquid may be stored as a two-liquid CMP polishing liquid (a polishing liquid set for CMP) in which the constituent components are divided into a cerium oxide slurry (a first liquid) containing the cerium oxide particles, the dispersant and water, and an additives liquid (a second liquid) containing the water-soluble polymer and water.

The single-liquid CMP polishing liquid may include additives such as an organic acid in addition to the water-soluble polymer. In the case of a two-liquid CMP polishing liquid, additives other than the water-soluble polymer may be included in either the cerium oxide slurry or the additives liquid, but in terms of preventing any effects on the dispersion stability of the cerium oxide particles, are preferably added to the additives liquid.

In those cases when the polishing liquid is stored as two-liquid CMP polishing liquid separated into a cerium oxide slurry and an additives liquid, the smoothness characteristics and the polishing rate can be adjusted by appropriately altering the blend of the two liquids. When polishing is performed using a two-liquid CMP polishing liquid, either a method in which the cerium oxide slurry and the additives liquid are fed through separate lines, these lines are converged at a point just before the line outlets to mix the two liquids, and the mixed liquid is then supplied to the polishing surface plate, or a method in which the cerium oxide slurry and the additives liquid are mixed just before polishing may be used.

If necessary, the polishing liquid for CMP may be adjusted to a desired pH before being used in polishing. There are no particular limitations on the pH modifier used, and examples include inorganic acids such as nitric acid, sulfuric acid, hydrochloric acid, phosphoric acid and boric acid, and bases such as sodium hydroxide, ammonia water, potassium hydroxide and calcium hydroxide. In those cases where the CMP polishing liquid is used for polishing a semiconductor substrate, ammonia water or an acid component can be used particularly favorably. Organic acids mentioned above or ammonium salts of water-soluble polymers that have been partially neutralized in advance with ammonia may also be used for the pH adjustment.

From the viewpoint of improving the storage stability of the CMP polishing liquid, and from the viewpoint of reducing the number of scratches on the polishing target region, the pH of the CMP polishing liquid is preferably at least 3.0, more preferably at least 3.5, even more preferably at least 4.0, and particularly preferably 4.5 or higher. Further, from the viewpoint of ensuring satisfactory improvement in the smoothness characteristics, the pH of the CMP polishing liquid is preferably not more than 7.0, more preferably not more than 6.7, and even more preferably 6.5 or lower.

The pH of the CMP polishing liquid can be measured using a pH meter (for example, a "Model F-51" manufactured by Horiba, Ltd.). For example, measurement may be performed by performing two-point calibration using standard buffer solutions (phthalate pH buffer solution, pH: 4.21 (25° C.), neutral phosphate pH buffer solution, pH: 6.86 (25° C.)), subsequently placing the electrode in the CMP polishing liquid, and measuring the pH once the value has stabilized after at least 2 minutes at 25° C.

(Polishing Method)

The method for polishing a substrate according to an embodiment of the present invention is a method for polishing a substrate having an insulating material formed thereon which uses the polishing liquid for CMP described above to remove unnecessary portions of the insulating material. The method is preferably a method in which a polishing target surface of a substrate having an insulating material as a polishing target formed thereon is pressed against a polishing cloth on a polishing surface plate, and the substrate and the polishing surface plate are then moved relative to each other, while the polishing liquid for CMP described above is supplied to a location between the polishing target surface of the substrate and the polishing cloth, thereby removing unnecessary portions of the insulating material.

Examples of the substrate having the insulating material formed thereon include substrates used in semiconductor element production, for example, semiconductor substrates having an insulating material formed thereon, such as a semiconductor substrate at the stage where a circuit element and a wiring pattern have been formed, and a semiconductor substrate at the stage where a circuit element has been formed.

Examples of the insulating material include silicon-based insulating materials and organic insulating materials. Examples of the silicon-based insulating materials include silica-based materials such as silicon oxide, fluorosilicate glass, organosilicate glass, silicon oxynitride and hydrogenated silsesquioxanes, as well as silicon carbide and silicon nitride. Further, examples of the organic insulating materials include fully aromatic low-dielectric constant interlayer insulating materials. The insulating material may be doped with an element such as phosphorus or boron.

By polishing an insulating material formed using the above type of material with the polishing liquid for CMP described above, unevenness on the surface of the insulating material can be eliminated, and a smooth surface can be achieved across the entire substrate. Further, the method for polishing a substrate according to the present embodiment may also be used for STI.

In a semiconductor substrate, the insulating material functions as an interlayer insulation film, a BPSG film (borophosphosilicate glass), or an STI film or the like. The insulating material may be doped with an element such as phosphorus or boron. Examples of the method used for producing the insulating material include low-pressure CVD methods and plasma CVD methods.

The method for polishing a substrate is described below in further detail, using the example of a semiconductor substrate having an insulating material formed thereon.

A typical polishing apparatus having a holder for holding the semiconductor substrate having the insulating material formed thereon, and a polishing surface plate which can be fitted with a polishing cloth (pad) and connected to a motor or the like capable of altering the rotational speed can be used as the polishing apparatus. For example, a polishing apparatus "Reflexion LK" manufactured by Applied Materials, Inc. or similar can be used as the polishing apparatus.

There are no particular limitations on the polishing cloth, and cloths formed from a typical nonwoven fabric, porous urethane resin, or porous fluororesin or the like can be used. Further, the polishing cloth is preferably subjected to groove machining to enable the CMP polishing liquid to be retained on the cloth.

There are no particular limitations on the polishing conditions, but in order to prevent the semiconductor substrate flying off, the rotational speed of the polishing surface plate is preferably not more than 200 $min^{-1}$. In order to prevent the occurrence of scratching following the polishing, the pressure applied to the semiconductor substrate (the processing load) is preferably not more than 100 kPa. During polishing, the CMP polishing liquid is supplied continuously to the polishing cloth using a pump or the like. There are no limitations on the supply volume, but the surface of the polishing cloth is preferably always coated with the CMP polishing liquid.

Following the completion of polishing, the semiconductor substrate is preferably washed thoroughly with running water, and a spin dryer or the like is preferably used to spin off any water droplets adhered to the semiconductor substrate, before the substrate is dried.

By polishing the insulating material that represents the polishing target with the CMP polishing liquid in this manner, protruding portions of the uneven insulating material are removed preferentially to the recessed portions. As a result, surface unevenness is eliminated, and a smooth surface is obtained across the entire surface of the semiconductor substrate. For example, following the formation of a smoothed shallow trench pattern, wiring containing aluminum or copper or the like is formed on top of the insulating material, additional insulating material is formed between and on top of the wiring, and the CMP polishing liquid is then used to polish the insulating material to obtain a smooth surface. By repeating these steps a prescribed number of times, a semiconductor substrate having a prescribed number of layers can be produced.

The polishing liquid for CMP according to an embodiment of the present invention may be applied not only to insulating materials formed on semiconductor substrates, but also to various other production processes and the like for semiconductor devices. Moreover, the polishing liquid for CMP can also be applied to the polishing of insulating materials such as silicon oxide films, glass or silicon nitride formed on wiring boards having prescribed wiring patterns; films containing mainly polysilicon, Al, Cu, Ti, TiN, W, Ta, or TaN or the like; optical glass including photomasks, lenses and prisms; inorganic conductive films such as ITO; optical integrated circuits containing glass and crystalline materials, optical switching elements, and optical wave guides and the like; the end faces of optical fibers; optical single crystals such as scintillators; solid-state laser single crystals; sapphire substrates for blue laser LEDs; semiconductor single crystals of SiC, GaP, or GaAs or the like; glass substrates for magnetic disks; and magnetic heads and the like.

EXAMPLES

The present invention is described below using a series of examples, but the present invention is in no way limited by these examples.

Example 1

(Preparation of Cerium Oxide)

Forty kg of commercially available cerium carbonate hydrate was placed in an alumina container and then fired at 800° C. for two hours in the open air to obtain 20 kg of a yellowish white powder. Phase identification of this powder by X-ray diffraction confirmed the powder was cerium oxide. Measurement of the main peak half-value width of the cerium oxide yielded a result of 0.27°.
(Preparation of Cerium Oxide Powder)

Twenty kg of the cerium oxide produced in the manner described above was subjected to dry grinding (grinding 1) using a jet mill, thus obtaining a cerium oxide powder. Measurement of the main peak half-value width of this cerium oxide powder yielded a result of 0.30°. The dry grinding conditions included a treatment repetition number of 2 passes and a pressure of 0.6 MPa.
(Preparation of Cerium Oxide Ground Liquid)

Next, 100.0 g of the cerium oxide powder produced in the manner described above was mixed with 897.5 g of deionized water, 2.5 g of an aqueous solution of an ammonium polyacrylate (weight-average molecular weight: 8,000, 40% by mass) was added as a dispersant, and wet grinding (grinding 2) was performed under stirring to obtain a cerium oxide ground liquid. Measurement of the main peak half-value width for the cerium oxide particles contained in the cerium oxide ground liquid yielded a result of 0.36°. The wet grinding conditions included a treatment repetition number of 25 passes and a pressure of 200 MPa. Further, the sample used for measuring the main peak half-value width for the cerium oxide particles was a dry powder prepared by drying 10 g of the obtained cerium oxide ground liquid at 150° C. for one hour.
(Preparation of Cerium Oxide Slurry)

The cerium oxide ground liquid prepared in the manner described above was subjected to centrifugal separation, and the supernatant was collected so as to achieve an average particle size (D50) of 150 nm. A centrifuge "himac CF12RX, T3S51" (manufactured by Hitachi Koki Co., Ltd.) was used under conditions including a rotational rate of 2,500 min$^{-1}$, a time of 5 min and a temperature of 25° C. The thus obtained supernatant was then diluted with deionized water to achieve a concentration of cerium oxide particles of 4.0% by mass, thus obtaining a cerium oxide slurry. Measurement of the main peak half-value width for the cerium oxide particles contained in the cerium oxide slurry revealed a result of 0.33°. Preparation of the measurement sample was performed in the same manner as that described for the cerium oxide ground liquid.

Using a laser diffraction particle size distribution analyzer "Microtrac MT3000II" (manufactured by Nikkiso Co., Ltd.), the average particle size (D50) of the cerium oxide particles in the cerium oxide slurry was measured. In order to perform the measurement, a measurement sample was prepared by diluting the slurry to achieve a DV value of 0.0010 to 0.0013. For the measurement, the particle refractive index was set to 2.20 and the dispersion medium refractive index was set to 1.333. The D50 value was 150 nm and the D99 value was 330 nm.

The number of cerium oxide particles having a particle size of 1.15 μm or greater was measured using a large particle measuring apparatus "AccuSizer 780 AD" (manufactured by Particle Sizing Systems, Inc.). Measurement of the number of cerium oxide particles having a particle size of 1.15 μm or greater was conducted using a measurement sample obtained by diluting the aforementioned slurry with ion-exchanged water to achieve a concentration of 4 μg of the cerium oxide particles per 50 mL of the ion-exchanged water. The measurement conditions included a measurement starting concentration of not more than 9,000 particles/mL, a measurement time of 90 seconds, and a measurement flow rate of 60 mL/min. The number of cerium oxide particles having a particle size of 1.15 μm or greater was 1,800×10$^3$ particles/mL.
(Preparation of Additives Liquid)

First, 0.084 g of p-toluenesulfonic acid monohydrate as an organic acid and 700 g of deionized water were mixed, 1.75 g of an aqueous solution of a polyacrylic acid (weight-average molecular weight: 4,000, 40% by mass) was added as a water-soluble polymer, and then ammonia water (25% by mass) was added to alter the pH to 4.5. Subsequently, deionized water was added to make the total mass up to 740.0 g, thus completing preparation of an additives liquid.
(Preparation of Cerium Oxide CMP Polishing Liquid)

First, 250.0 g of the cerium oxide slurry was added to the prepared additives liquid, and ammonia water (25% by mass) was then added to adjust the pH to 6.0. Subsequently, deionized water was added to make the total mass up to 1,000 g and complete preparation of a cerium oxide CMP polishing liquid. The cerium oxide CMP polishing liquid contained 1.0% by mass of cerium oxide particles, as well as 0.07% by mass of the polyacrylic acid (water-soluble polymer) and 0.0076% by mass of the p-toluenesulfonic acid (organic acid) as additives.

The average particle size of the cerium oxide particles in the cerium oxide CMP polishing liquid was measured by preparing a measurement sample in the same manner as that described above, and then measuring the sample using a laser diffraction particle size distribution analyzer. The D50 value was 150 nm and the D99 value was 330 nm. Similarly, the number of cerium oxide particles having a particle size of 1.15 μm or greater within the cerium oxide CMP polishing liquid was measured by preparing a measurement sample in the same manner as that described above, and then performing a measurement using a large particle measuring apparatus. The number of cerium oxide particles was 1,800× $10^3$ particles/mL. The pH of the cerium oxide CMP polishing liquid was 6.0.

Examples 2 to 7 and Comparative Examples 1 to 12

With the exceptions of altering the conditions for the grinding 1, the grinding 2 and the centrifugal separation in accordance with the conditions shown in Tables 1 and 2, and altering the amount added of the organic acid to the amount shown in Table 3, the same method as Example 1 was used to prepare the cerium oxide CMP polishing liquids shown in Table 3. Dilution with deionized water of the supernatant obtained following the centrifugal separation was performed where necessary to adjust the concentration of cerium oxide particles to 4.0% by mass. The cerium oxide CMP polishing liquids each contained 1.0% by mass of cerium oxide particles, and 0.07% by mass of the polyacrylic acid (water-soluble polymer) and the amount of the p-toluenesulfonic acid (organic acid) shown in Table 3 (either 0 or 0.0076% by mass) as additives. The pH of each cerium oxide CMP polishing liquid was 6.0.

TABLE 1

| | Cerium oxide ground liquid | Firing temp. [° C.] | Firing time [h] | Main peak half-value width after firing [°] | Grinding 1 conditions (dry grinding) | Main peak half-value width after grinding 1 [°] | Grinding 2 conditions (wet grinding) | Main peak half-value width after grinding 2 [°] | Centrifugal separation conditions | Main peak half-value width after centrifugal separation [°] |
|---|---|---|---|---|---|---|---|---|---|---|
| Example 1 | A | 800 | 2 | 0.27 | 2 pass 0.6 MPa | 0.30 | 25 pass 200 MPa | 0.36 | 2500 rpm 5 min, 25° C. | 0.33 |
| Example 2 | B | 800 | 2 | 0.23 | 2 pass 0.6 MPa | 0.26 | 25 pass 200 MPa | 0.32 | 2500 rpm 5 min, 25° C. | 0.29 |
| Example 3 | C | 800 | 2 | 0.27 | 2 pass 0.6 MPa | 0.30 | 25 pass 200 MPa | 0.36 | 2700 rpm 5 min, 25° C. | 0.33 |
| Example 4 | D | 750 | 2 | 0.28 | 2 pass 0.6 MPa | 0.29 | 25 pass 200 MPa | 0.38 | 2700 rpm 5 min, 25° C. | 0.35 |
| Example 5 | A | 800 | 2 | 0.27 | 2 pass 0.6 MPa | 0.30 | 25 pass 200 MPa | 0.36 | 2500 rpm 5 min, 25° C. | 0.33 |
| Example 6 | B | 800 | 2 | 0.23 | 2 pass 0.6 MPa | 0.26 | 25 pass 200 MPa | 0.32 | 2500 rpm 5 min, 25° C. | 0.29 |
| Example 7 | C | 800 | 2 | 0.27 | 2 pass 0.6 MPa | 0.30 | 25 pass 200 MPa | 0.36 | 2700 rpm 5 min, 25° C. | 0.33 |

TABLE 2

| | Cerium oxide ground liquid | Firing temp. [° C.] | Firing time [h] | Main peak half-value width after firing [°] | Grinding 1 conditions (dry grinding) | Main peak half-value width after grinding 1 [°] | Grinding 2 conditions (wet grinding) | Main peak half-value width after grinding 2 [°] | Centrifugal separation conditions | Main peak half-value width after centrifugal separation [°] |
|---|---|---|---|---|---|---|---|---|---|---|
| Comparative Example 1 | E | 800 | 2 | 0.27 | 2 pass 0.6 MPa | 0.30 | 25 pass 200 MPa | 0.36 | 3000 rpm 5 min, 25° C. | 0.33 |
| Comparative Example 2 | F | 850 | 2 | 0.19 | 2 pass 0.6 MPa | 0.22 | 25 pass 200 MPa | 0.28 | 2500 rpm 5 min, 25° C. | 0.24 |
| Comparative Example 3 | G | 700 | 2 | 0.36 | 2 pass 0.6 MPa | 0.40 | 25 pass 200 MPa | 0.44 | 2500 rpm 5 min, 25° C. | 0.38 |
| Comparative Example 4 | E | 800 | 2 | 0.27 | 2 pass 0.6 MPa | 0.30 | 20 pass 200 MPa | 0.36 | 2000 rpm 5 min, 25° C. | 0.32 |
| Comparative Example 5 | H | 750 | 2 | 0.32 | 2 pass 0.6 MPa | 0.35 | 20 pass 200 MPa | 0.40 | 2000 rpm 5 min, 25° C. | 0.36 |
| Comparative Example 6 | I | 850 | 2 | 0.19 | 2 pass 0.6 MPa | 0.22 | 20 pass 200 MPa | 0.27 | 2000 rpm 5 min, 25° C. | 0.24 |
| Comparative Example 7 | J | 700 | 2 | 0.36 | 2 pass 0.6 MPa | 0.40 | 20 pass 200 MPa | 0.43 | 2000 rpm 5 min, 25° C. | 0.40 |
| Comparative Example 8 | K | 800 | 2 | 0.27 | 2 pass 0.6 MPa | 0.30 | — | — | 1000 rpm 3 min, 25° C. | 0.31 |
| Comparative Example 9 | K | 800 | 2 | 0.27 | 2 pass 0.6 MPa | 0.30 | — | — | 1000 rpm 5 min, 25° C. | 0.30 |
| Comparative Example 10 | L | 700 | 2 | 0.36 | 2 pass 0.6 MPa | 0.40 | — | — | 1000 rpm 5 min, 25° C. | 0.40 |
| Comparative Example 11 | F | 850 | 2 | 0.19 | 2 pass 0.6 MPa | 0.22 | 25 pass 200 MPa | 0.28 | 2500 rpm 5 min, 25° C. | 0.24 |
| Comparative Example 12 | G | 700 | 2 | 0.36 | 2 pass 0.6 MPa | 0.40 | 25 pass 200 MPa | 0.28 | 2500 rpm 5 min, 25° C. | 0.38 |

(Polishing of Insulating Film)

A blanket wafer "P-TEOS 1.0 μm" manufactured by Advantech Co., Ltd. (a wafer having a silicon oxide film formed thereon by TEOS-CVD, diameter: 300 mm) was used as a polishing test wafer.

A polishing apparatus ("Reflexion LK", manufactured by Applied Materials, Inc.) was used for polishing the polishing test wafer. The wafer was mounted on a holder having a suction pad for substrate mounting. A porous urethane resin polishing cloth (grooved shape, concentric circle type, "IC1010" manufactured by Rohm and Haas Company) was affixed to the 600 mm-diameter polishing surface plate of the polishing apparatus. The above holder was mounted on the polishing surface plate with the insulating film (silicon oxide film) that represented the polishing target film facing downward, and the processing load was set to 21.0 kPa.

The polishing surface plate and the polishing test wafer were each rotated at a rotational rate of 90 min' while the cerium oxide CMP polishing liquid was supplied to the polishing surface plate at a rate of 250 mL/min, and the wafer was polished for 1 min. Following polishing, the wafer was washed with pure water and then dried.

(Measurement of Polishing Rate)

The insulating film thickness before polishing and the insulating film thickness after polishing were measured, and the polishing rate was calculated from the difference in the film thickness from before to after polishing and the polishing time. Measurements of the film thickness were performed using a film thickness meter "F-80" manufactured by Filmetrics, Inc.

(Measurement of Number of Polishing Scratches)

Using an inspection apparatus "Complus" manufactured by Applied Materials, Inc., anomalies (recesses and adhered matter) on the polishing test wafer following the completion of polishing were detected, with the anomaly detection size set to 0.2 μm or more. Because the detected anomalies included adhered matter in addition to scratches, each anomaly was inspected using a scanning electron microscope (SEM) "Vision G3" manufactured by Applied Materials, Inc. Recesses were identified as polishing scratches, and the number of polishing scratches was counted.

Figure 2:
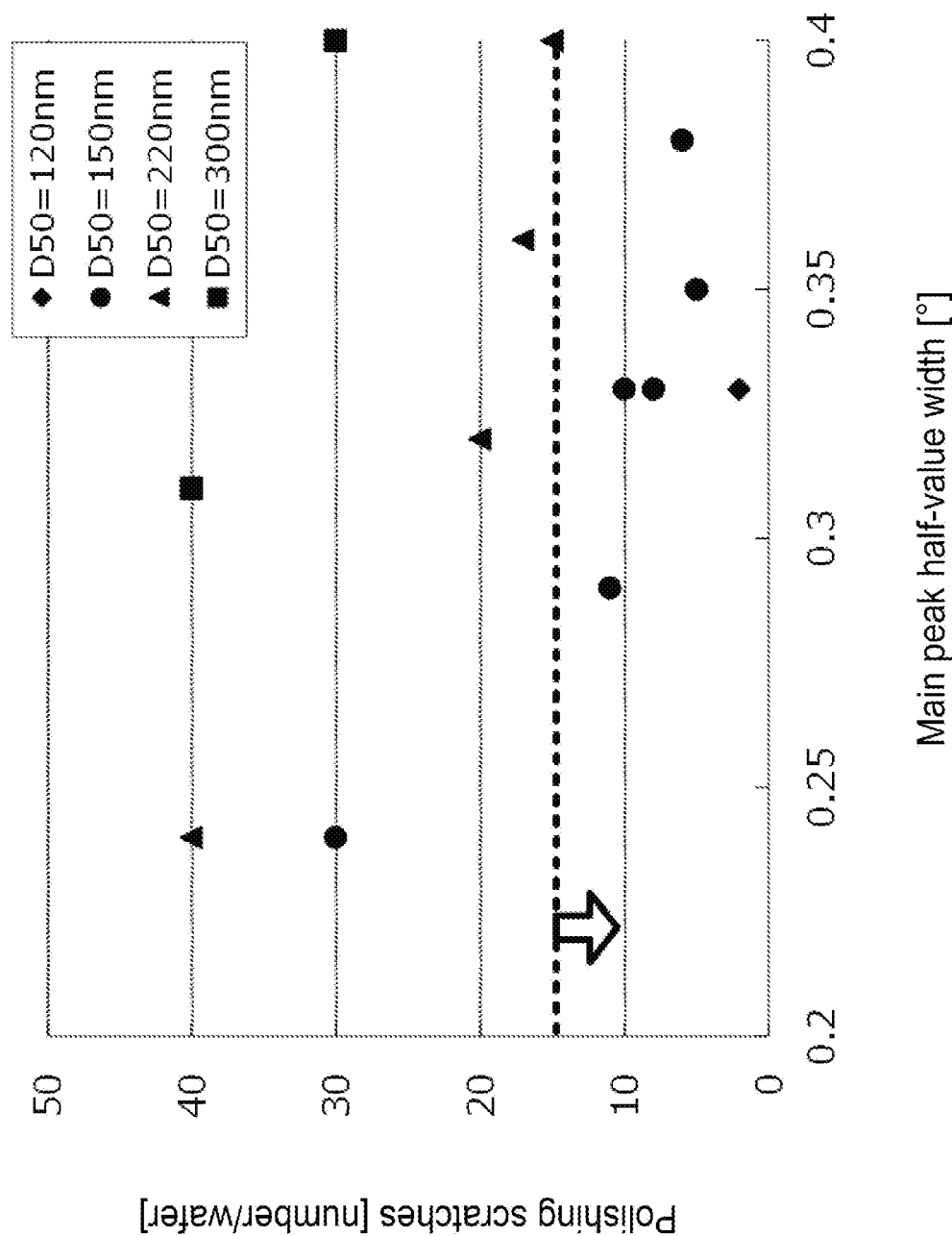
FIG. 2 is a graph illustrating the relationship between the main peak half-value width for cerium oxide particles and the number of polishing scratches, for CMP polishing liquids obtained in a series of examples and comparative examples.

The results are shown in Table 3. The relationships, obtained from Table 3, between the main peak half-value width and the particle size of the cerium oxide, and the polishing rate and the polishing scratches are shown in FIG. 1 and FIG. 2 respectively (Examples 1 to 4, and Comparative Examples 1 to 8 and 10). Based on Table 3 and FIGS. 1 and 2, it is clear that the polishing liquids for CMP according to embodiments of the present invention increased the polishing rate of the insulating material and achieved a reduction in the number of polishing scratches.

TABLE 3

|  | Cerium oxide ground liquid | main peak half-value width (° C.) | D50 (nm) | D99 (nm) | Number of particles having particle size of 1.15 μm or greater ($\times 10^3$ particles/mL) | Organic acid concentration (% by mass) | Polishing rate (nm/min) | Number of polishing scratches (number/wafer) |
|---|---|---|---|---|---|---|---|---|
| Example 1 | A | 0.33 | 150 | 330 | 1,800 | 0.0076 | 280 | 10 |
| Example 2 | B | 0.29 | 150 | 330 | 2,500 | 0.0076 | 300 | 11 |
| Example 3 | C | 0.33 | 150 | 320 | 700 | 0.0076 | 270 | 8 |
| Example 4 | D | 0.35 | 150 | 300 | 300 | 0.0076 | 260 | 5 |
| Example 5 | A | 0.33 | 150 | 330 | 1,800 | 0 | 300 | 10 |
| Example 6 | B | 0.29 | 150 | 330 | 2,500 | 0 | 320 | 13 |
| Example 7 | C | 0.33 | 150 | 320 | 700 | 0 | 290 | 10 |
| Comparative Example 1 | E | 0.33 | 120 | 230 | 50 | 0.0076 | 150 | 2 |
| Comparative Example 2 | F | 0.24 | 150 | 270 | 50 | 0.0076 | 330 | 30 |
| Comparative Example 3 | G | 0.38 | 150 | 310 | 700 | 0.0076 | 200 | 6 |
| Comparative Example 4 | E | 0.32 | 220 | 880 | 5,000 | 0.0076 | 350 | 20 |
| Comparative Example 5 | H | 0.36 | 220 | 880 | 5,000 | 0.0076 | 290 | 17 |
| Comparative Example 6 | I | 0.24 | 220 | 880 | 5,000 | 0.0076 | 380 | 40 |
| Comparative Example 7 | J | 0.40 | 220 | 880 | 5,000 | 0.0076 | 200 | 15 |
| Comparative Example 8 | K | 0.31 | 300 | 1100 | 1,000,000 | 0.0076 | 350 | 40 |
| Comparative Example 9 | K | 0.30 | 420 | 1400 | 1,300,000 | 0.0076 | 390 | 60 |
| Comparative Example 10 | L | 0.40 | 300 | 1100 | 1,000,000 | 0.0076 | 300 | 30 |
| Comparative Example 11 | F | 0.24 | 150 | 270 | 50 | 0 | 350 | 35 |
| Comparative Example 12 | G | 0.38 | 150 | 310 | 700 | 0 | 220 | 5 |

The invention claimed is:

1. A polishing liquid for CMP comprising cerium oxide particles and water, wherein
a powder X-ray diffraction chart of the cerium oxide particles includes a main peak appearing within a range from 2θ=27.000 to 29.980°,
the main peak is a peak of cerium oxide,
a half-value width of the main peak is from 0.26 to 0.36°,
an average particle size of the cerium oxide particles is at least 130 nm but less than 175 nm, and
a number of cerium oxide particles having a particle size of 1.15 μm or greater is not more than 5,000×10³ particles/mL.

2. The polishing liquid for CMP according to claim 1, further comprising a water-soluble polymer.

3. A polishing liquid set for CMP that is used for obtaining the polishing liquid for CMP according to claim 2,
the polishing liquid set for CMP comprising a first liquid containing cerium oxide particles and water, and a second liquid containing a water-soluble polymer and water.

4. A method for polishing a substrate having an insulating material formed thereon, the method comprising removing an unnecessary portion of the insulating material using the polishing liquid for CMP according to claim 1.

5. A method for polishing a substrate having an insulating material formed thereon, the method comprising removing an unnecessary portion of the insulating material using a polishing liquid for CMP obtained using the polishing liquid set for CMP according to claim 3.

6. A method for polishing a substrate having an insulating material formed thereon, the method comprising removing an unnecessary portion of the insulating material using the polishing liquid for CMP according to claim 2.

* * * * *